(12) United States Patent  
Kim (10) Patent No.: US 8,399,324 B2  
(45) Date of Patent: Mar. 19, 2013

(54) SEMICONDUCTOR DEVICE AND METHOD OF FABRICATING THE SAME

(75) Inventor: Myung-Ok Kim, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 310 days.

(21) Appl. No.: 12/318,168

(22) Filed: Dec. 23, 2008

(65) Prior Publication Data

US 2009/0250732 A1    Oct. 8, 2009

(30) Foreign Application Priority Data

Apr. 4, 2008 (KR) .................. 10-2008-0031475

(51) Int. Cl.
*H01L 21/336* (2006.01)
(52) U.S. Cl. .................. 438/269; 438/268
(58) Field of Classification Search .............. 438/268, 438/269
See application file for complete search history.

(56) References Cited

U.S. PATENT DOCUMENTS

| 6,426,259 | B1 * | 7/2002 | Yu | 438/269 |
| 6,632,712 | B1 * | 10/2003 | Ang et al. | 438/212 |
| 6,882,006 | B2 * | 4/2005 | Maeda et al. | 257/329 |
| 2005/0048711 | A1 | 3/2005 | Wang | |
| 2006/0146640 | A1 * | 7/2006 | Kim | 365/232 |
| 2007/0066019 | A1 * | 3/2007 | Forbes | 438/283 |
| 2007/0210403 | A1 * | 9/2007 | Sandhu | 257/499 |
| 2007/0252201 | A1 * | 11/2007 | Kito et al. | 257/331 |
| 2009/0166725 | A1 * | 7/2009 | Lee | 257/329 |

FOREIGN PATENT DOCUMENTS

| CN | 1819205 | 8/2006 |
| CN | 1897255 | 1/2007 |
| KR | 100242379 | 11/1999 |
| KR | 1020070002787 | 1/2007 |
| KR | 10-2007-0038233 | 4/2007 |
| KR | 1020090106016 | 10/2009 |

OTHER PUBLICATIONS

Office Action dated Jan. 21, 2010, for Korean application No. 10-2008-0031475.
Korean Notice of Allowance for Korean application No. 10-2008-0031475.
Chinese Patent Certificate and Publication of Granted Chinese invention dated Jul. 20, 2011.

* cited by examiner

*Primary Examiner* — Zandra Smith
*Assistant Examiner* — Jamie C Niesz
(74) *Attorney, Agent, or Firm* — Lowe Hauptman Ham & Berner LLP (57) ABSTRACT

In a method of fabricating a semiconductor device on a substrate having thereon a conductive layer, the conductive layer is patterned to form a plurality of opened regions. A gate insulation layer is formed on a sidewall of each of the opened regions. A pillar pattern is formed in each opened region. On each pillar pattern, a gate electrode, which encloses the pillar pattern, is formed by removing the conductive layer between the pillar patterns.

20 Claims, 9 Drawing Sheets

SEMICONDUCTOR DEVICE AND METHOD OF FABRICATING THE SAME

CROSS-REFERENCE TO RELATED APPLICATIONS

The present invention claims priority of Korean Patent Application No. 10-2008-0031475, filed on Apr. 4, 2008, which is incorporated herein by reference in its entirety.

BACKGROUND

The disclosure relates to a method of fabricating a semiconductor device, and more particularly, to a semiconductor device in which channels are formed in a vertical direction and to a method of fabricating such device.

As semiconductor device integrity increases, a semiconductor device with channels formed in an up and down direction relative to the substrate of the device (referred to herein as vertical channels), and capable of implementing a configuration of $4F^2$, has been known to the inventors as one method of improving cell efficiency.

Figure 1:
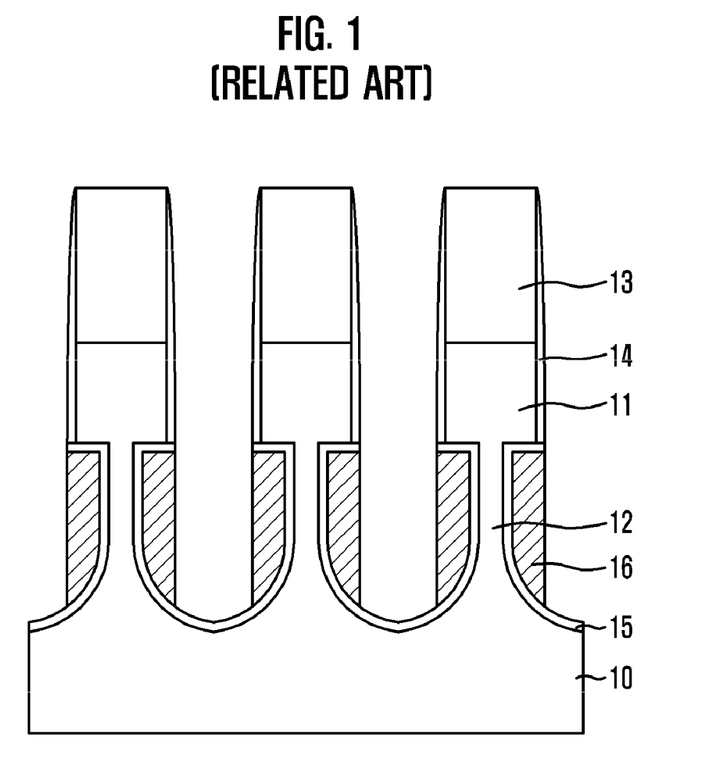
FIG. 1 is a schematic cross-sectional view of a known semiconductor device with vertical channels.

FIG. 1 is a schematic cross-sectional view of a known conventional semiconductor device with vertical channels.

Referring to FIG. 1, the known semiconductor device includes a substrate 10, a pillar pattern having a pillar head 11 and a pillar neck 12, a gate hard mask layer 13 for protecting an upper portion of the pillar pattern, a sidewall protection layer 14 for protecting a sidewall of the pillar head 11, a gate insulation layer 15 surrounding the pillar neck 12 and a gate electrode 16. Furthermore, source and drain regions may be formed on the substrate 10 and the pillar head 11, and a vertical channel may be formed in the pillar neck 12 to selectively connect the regions.

Figure 2:
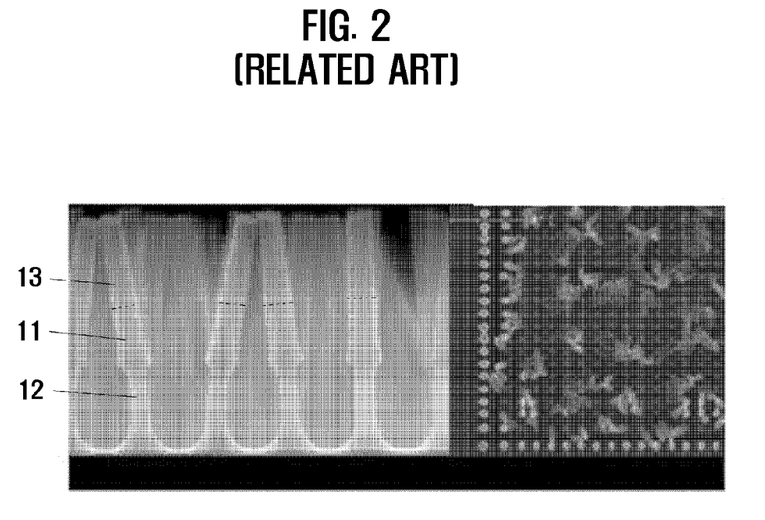
FIGS. 2-6 are electron microscopic pictures showing various defects that can occur in the known semiconductor device.

However, since a diameter of the pillar neck 12 is smaller than a diameter of the pillar head 11 and a gate hard mask layer 13 is placed over the pillar head 11 in the above configuration of the pillar pattern, it is potential that a pillar pattern may leans over or adheres to another pillar pattern, as shown in FIG. 2.

Figure 3:
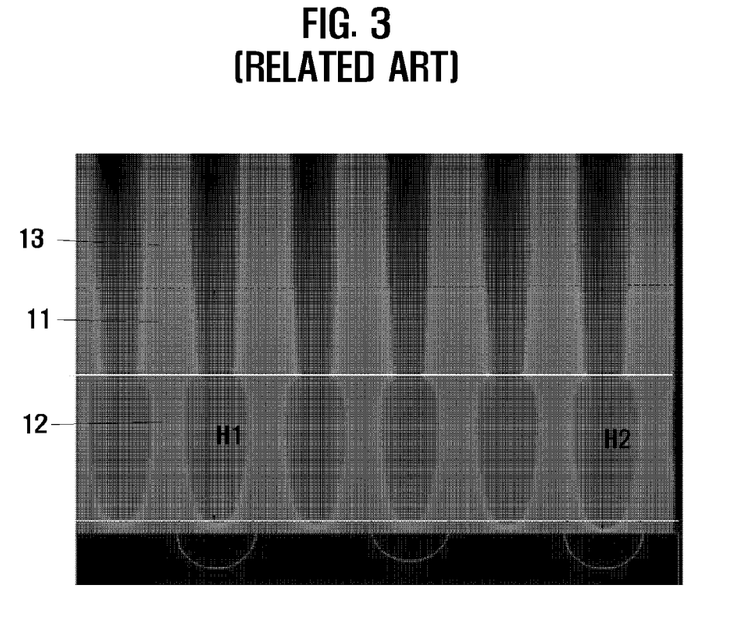

Also, since the pillar head 11 and pillar neck 12 are formed by etching without an etch stop layer, it is potential that the heights of respective pillar patterns are not even such as H1<H2. This results in different channel lengths in different pillar patterns, as shown in FIG. 3.

Figure 4:
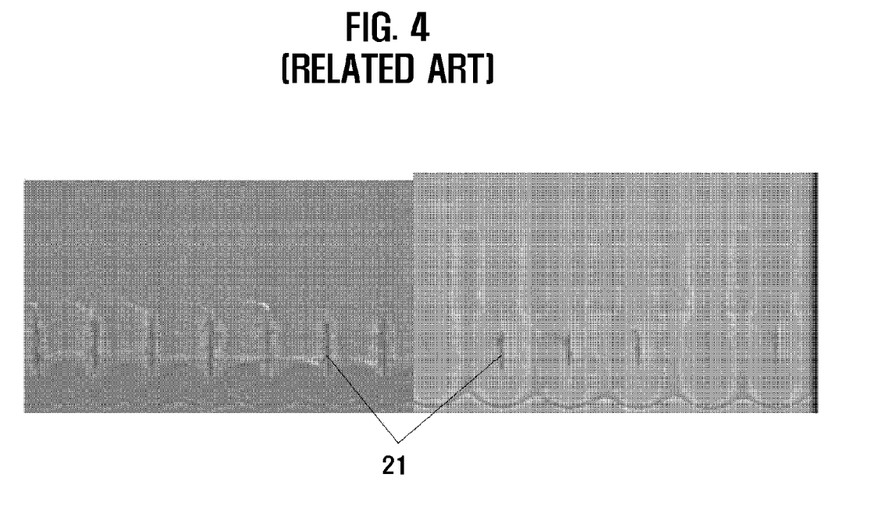
Figure 5:
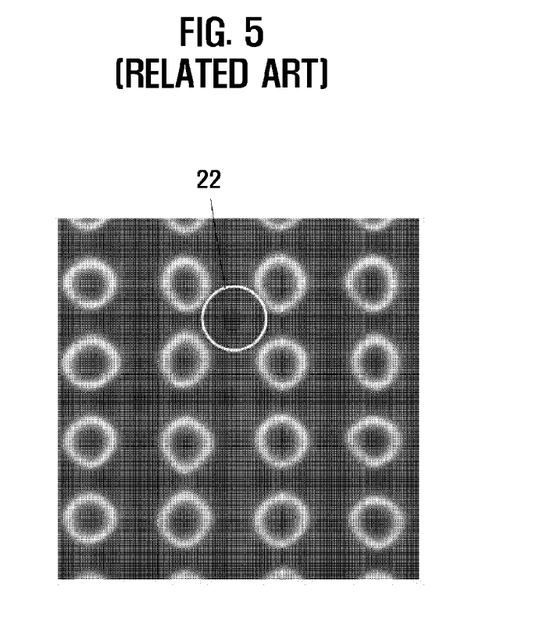
Figure 6:
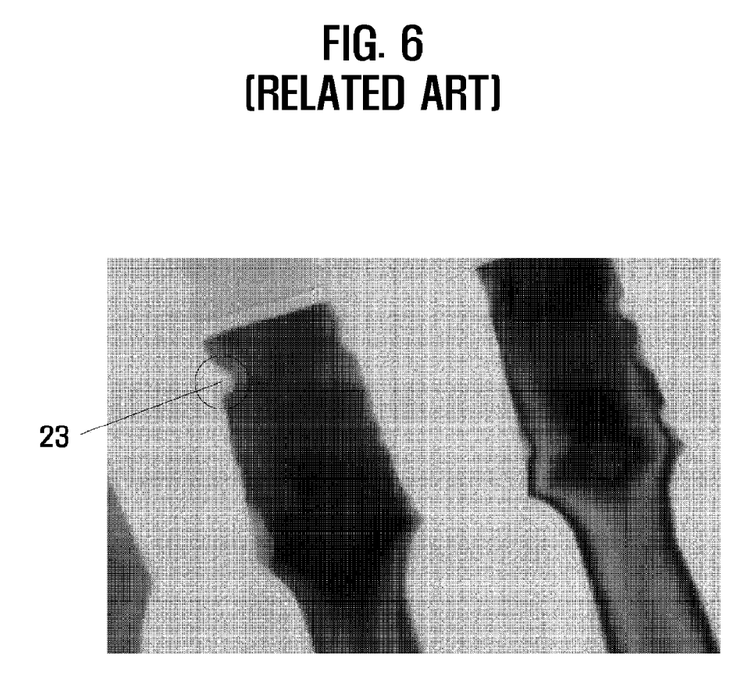

In addition, when a conductive layer is filled in the space between adjacent pillar patterns in order to later form the gate electrode 16, voids 21 and seams are potentially formed inside the conductive layer due to a high aspect ratio between the pillar patterns, as shown in FIG. 4. When a process of patterning the conductive layer is performed later, the gate insulation layer 15 and the substrate 10 are potentially punched through (see 22 of FIG. 5) due to different etching speeds originating from the presence of the aforementioned voids 21 and seams. Furthermore, the sidewall protection layer 14 is possibly lost excessively due to an inappropriate etching selection ratio during the conductive layer patterning process, which attacks the pillar head 11, as shown in FIG. 6 (see 23 of FIG. 6).

SUMMARY

In accordance with one or more embodiments, a method of fabricating a semiconductor device on a substrate having thereon a conductive layer comprises: patterning the conductive layer to form a plurality of opened regions; forming a gate insulation layer on a sidewall of each of the opened regions; forming a pillar pattern in each opened region; and forming on each pillar pattern a gate electrode, which encloses said pillar pattern, by removing the conductive layer between the pillar patterns.

In accordance with one or more embodiments, a method of fabricating a semiconductor device comprises: sequentially forming a first etch stop layer, a conductive layer, a second etch stop layer, and a plurality of hard mask layer patterns on a substrate; forming a plurality of opened regions by etching the second etch stop layer, the conductive layer and the first etch stop layer using the hard mask layer patterns as an etching barrier; forming a gate insulation layer on a sidewall of each of the opened regions; forming a pillar pattern inside each opened region; forming a gate hard mask layer pattern covering each pillar pattern and a portion of the conductive layer surrounding said pillar pattern; and forming on each pillar pattern a gate electrode from said portion of the conductive layer by etching portions of the conductive layer between the pillar patterns using the gate hard mask layer pattern as an etching barrier.

In accordance with one or more embodiments, a semiconductor device comprises: a substrate having at least one pillar pattern grown thereon, a gate insulation layer extending around and covering a sidewall of the at least one pillar pattern, a gate electrode extending around and partially covering the gate insulation layer, and a sidewall protection layer positioned above the gate electrode, extending around and partially covering the gate insulation layer.

BRIEF DESCRIPTION OF THE DRAWINGS

Various embodiments are illustrated by way of example, and not by limitation, in the figures of the accompanying drawings.

FIGS. 7A to 12B are schematic views that illustrate a method of fabricating a semiconductor device with vertical channels in accordance with various embodiments.

DESCRIPTION OF EMBODIMENTS

In the figures, the dimensions of layers and regions are exaggerated for clarity of illustration. Like reference numerals refer to like elements throughout the drawings. In addition, different English alphabetical characters following a reference numeral of a layer refer to different states of the layer after one or more processing steps, such as partial deformations of the layer by an etch process or a polishing process.

It will also be understood that when a layer is referred to as being "on/under" another layer or substrate, it can be directly on/under the other layer or substrate, or intervening layers may also be present. In addition, when a layer is referred to as being 'between' two layers, it can be the only layer between the two layers, or one or more intervening layers may also be present.

FIGS. 7A to 12B describe a method of fabricating a semiconductor device with vertical channels in accordance with various embodiments.

Figure 7A:
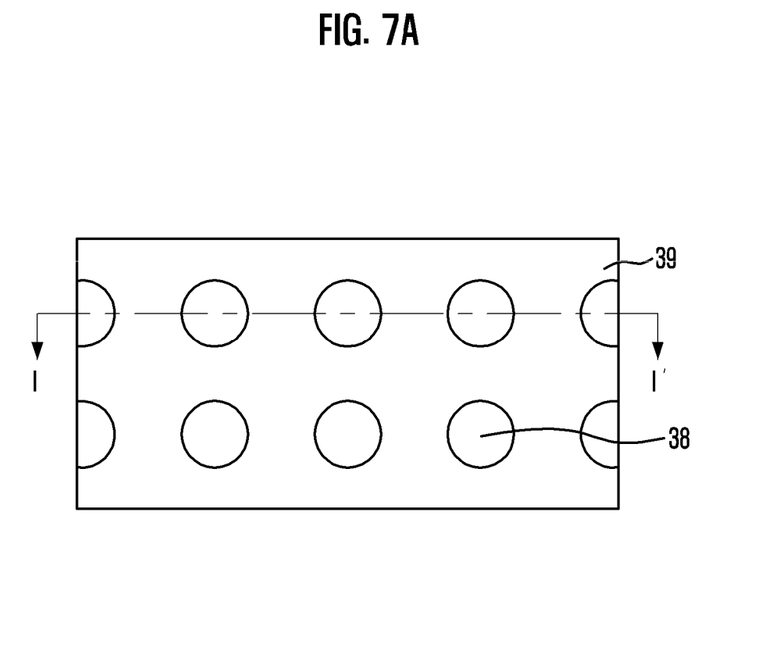
Figure 7B:
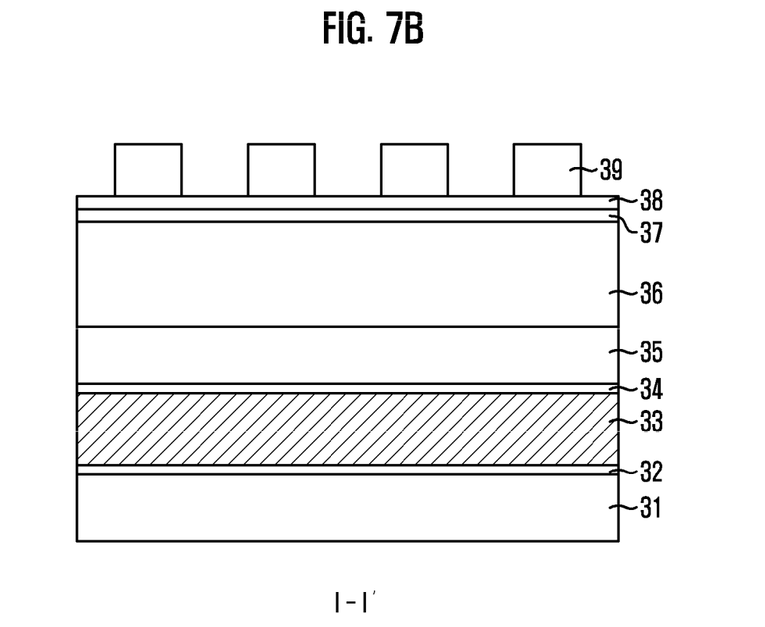

As shown in FIGS. 7A and 7B, a first insulation layer 32, a conductive layer 33, a second insulation layer 34 and a hard mask layer 35 are formed sequentially on a substrate 31.

The conductive layer 33 is a thin layer which will serve as a gate electrode, and comprises at least one thin layer of a material selected from the group consisting of polysilicon, tungsten silicide ($WSi_2$), titanium silicide ($TiSi_2$), tungsten (W), titanium nitride (TiN), tantalum (Ta) and tantalum nitride (TaN). For example, the conductive layer 33 in some embodiments has a stacked configuration of a tungsten layer and a titanium nitride layer, or a tungsten layer, a titanium nitride layer and a polysilicon layer.

The first insulation layer 32 is a thin layer for insulating between the substrate 31 and the conductive layer 33 and defining an etch stop layer in a subsequent etching process. The second insulation layer 34 is a thin layer for insulating between the conductive layer 33 and the hard mask layer 35 and defining another etch stop layer in a subsequent etching process. The first insulation layer 32 and/or the second insulation layer 34 comprise(s) any one thin layer selected from the group consisting of a silicon oxide layer ($SiO_2$), a silicon oxynitride layer, an aluminum oxide layer ($Al_2O_3$), a tantalum oxide layer ($Ta_2O_5$), a zirconium oxide layer ($ZrO2$), a hafnium oxide layer ($HfO_2$) and a radium oxide layer ($La_2O_3$). In some embodiments, the first insulation layer 32 and the second insulation layer 34 are formed of the same material.

The hard mask layer 35 serves as a thin layer for protecting an upper portion of a sidewall of a pillar pattern to be formed later. For this purpose, the hard mask layer 35 comprises any one thin layer selected from the group consisting of a nitride layer, an oxide layer and a silicon oxynitride layer.

Subsequently, an amorphous carbon layer 36, a silicon oxynitride layer (SiON) 37, an antireflection layer 38 and a photoresist pattern 39 are formed on the hard mask layer 35 to obtain a multilayer structure that has a top plan view as shown in FIG. 7A. FIG. 7B is a cross-sectional view taken long line I-I' of FIG. 7A.

The photoresist pattern 39 is formed with a plurality of holes corresponding to opened regions where pillar patterns are to be formed later. The holes are shown as circles in FIG. 7A in which the underlying layer 38 is shown as being exposed through the holes. Other, shapes for the holes are not excluded.

Figure 8:
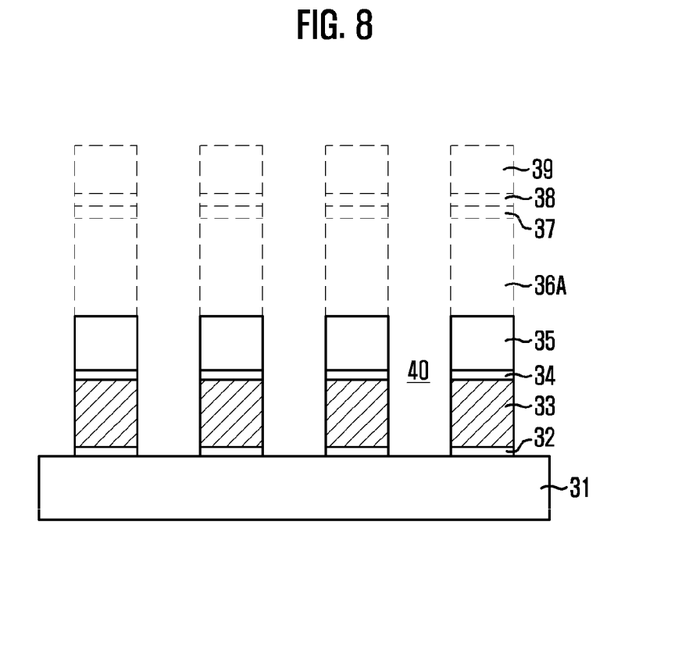

As shown in FIG. 8, the antireflection layer 38, the silicon oxynitride layer 37 and the amorphous carbon layer 36 are etched, in, e.g., a first etching process, using the photoresist pattern 39 as an etching barrier or mask. As a result, an amorphous carbon layer pattern 36A is formed by etching the amorphous carbon layer 36.

Subsequently, the hard mask layer 35 is etched, in, e.g., a second etching process, to form a plurality of hard mask layer patterns 35A using the amorphous carbon layer pattern 36A as an etching barrier or mask. After that, the second insulation layer 34, the conductive layer 33 and the first insulation layer 32 are etched subsequently, in, e.g., third and fourth etching processes, using the hard mask layer pattern 35A as an etching barrier or mask to form a plurality of opened regions 40.

To be specific, the hard mask layer 35 is etched, in the second etching process and using the amorphous carbon layer pattern 36A as an etching barrier or mask, and, in some embodiments, the etching is stopped on a surface of the second insulation layer 34. Subsequently, the second insulation layer 34 and the conductive layer 33 are etched, in the third etching process and using the hard mask layer pattern 35A as an etching barrier or mask, and in some embodiments the etching is stopped on a surface of the first insulation layer 32. Finally, the first insulation layer 32 is etched in the fourth etching process. In some embodiments, the etching may be stopped on a surface of the substrate 31. As a result, the opened regions 40 having substantially the same height are obtained.

Hereinafter, the etched second insulation layer 34, the conductive layer 33 and the first insulation layer 32 are referred to as a second insulation layer pattern 34A, a conductive layer pattern 33A and a first insulation layer pattern 32A, respectively.

Each opened region 40 is generally at 90° with respect to the substrate 31, and may have a slope ranging from approximately 70° to approximately 110°.

Next, the photoresist pattern 39, the antireflection layer 38, the silicon oxynitride layer 37 and the amorphous carbon layer pattern 36A are removed by any common removing process such as a cleaning process or a polishing process.

Figure 9:
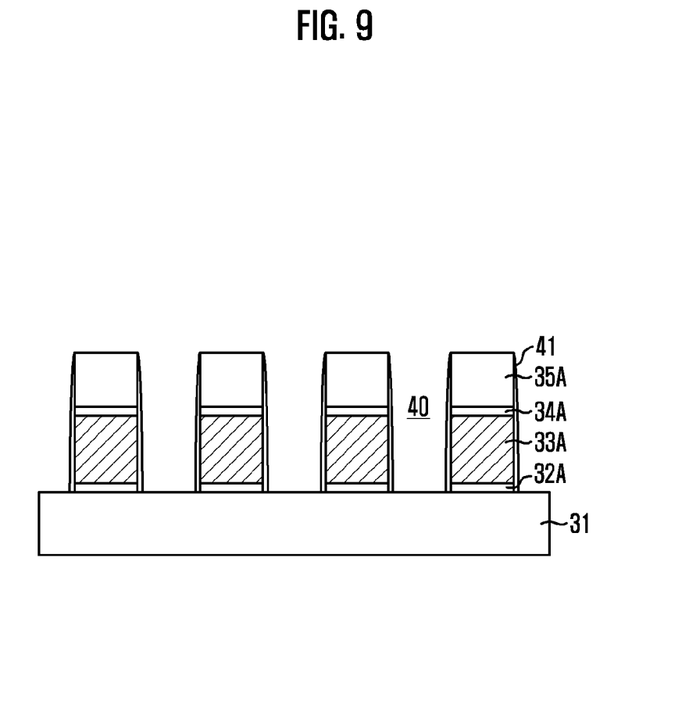

As shown in FIG. 9, a gate insulation layer 41 is formed on a sidewall of each opened region 40, i.e., the sidewalls of the first insulation layer pattern 32A, the conductive layer pattern 33A, the second insulation layer pattern 34A and the hard mask layer pattern 35A.

The gate insulation layer 41 is formed by (i) depositing at least one thin film selected from the group consisting of a silicon oxide layer ($SiO_2$), a silicon oxynitride layer, an aluminum oxide layer ($Al_2O_3$), a tantalum oxide layer ($Ta_2O_5$), a zirconium oxide layer ($ZrO_2$), a hafnium oxide layer ($HfO_2$) and a radium oxide layer ($La_2O_3$) along the profile of the substrate 31 where the opened regions 40 are formed, and (ii) performing an overall etching process. Accordingly, the gate insulation layer 41 exists only on the sidewall of each opened region 40 while the substrate 31 at the bottom of each opened region 40 remains exposed without being covered by the gate insulation layer 41.

Meanwhile, deposition thicknesses of the first insulation layer 32, the second insulation layer 34 and the gate insulation layer 41 are targeted in some embodiments to ensure the same level of final electrical thicknesses thereof.

Subsequently, the substrate 31 exposed at the bottom of each opened region 40 is doped with impurities to form an impurity region, and the impurity region is then divided by a division process to form a buried bit line. The buried bit line defines a data transfer line in the semiconductor device for inputting/outputting data to/from a capacitor (to be described hereinafter).

Figure 10A:
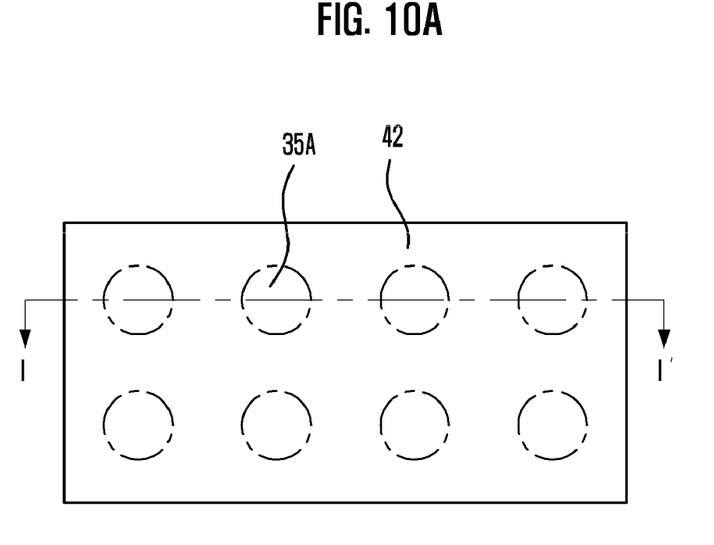
Figure 10B:
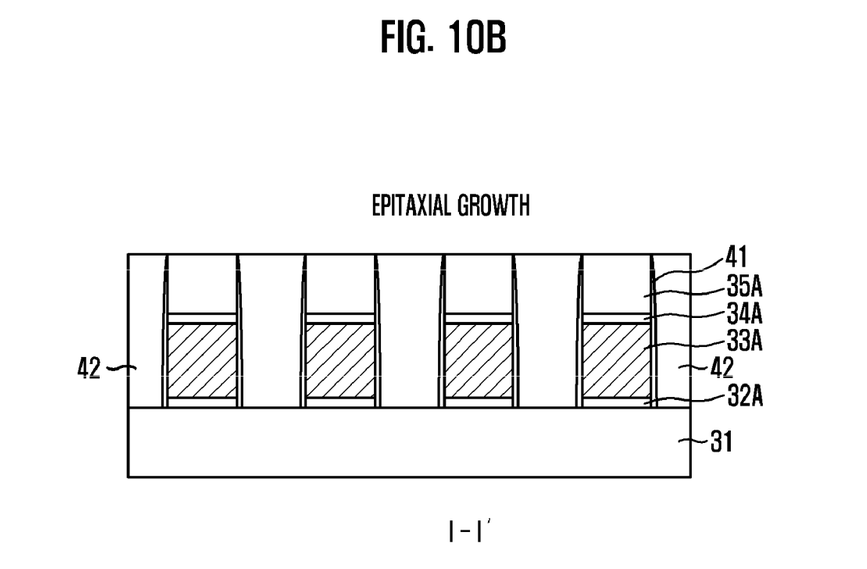

As shown in FIGS. 10A and 10B, a pillar pattern 42 is formed in each opened region 40 by performing an epitaxial growth process. FIG. 10A is a top plan view of the multilayer structure obtained after the epitaxial growth process. FIG. 10B is a cross-sectional view taken long line I-I' of FIG. 10A.

In particular, a plurality of pillar patterns 42 are each (i) formed with silicon (Si) crystals grown from the substrate 31 exposed at the bottom of one opened region 40 in the epitaxial growth process until the respective opened region 40 is buried or filled completely, and then (ii) planarized by performing a planarization process such as an etch back process or a chemical mechanical polishing. In some embodiments, the polishing may be stopped, or over-polishing may be performed, on an upper surface of the hard mask layer pattern 35A to thereby remove a portion of the hard mask layer pattern 35A.

The pillar patterns 42 formed in the epitaxial growth process have substantially the same diameter throughout its axial dimension, and sidewalls of the pillar patterns 42 have substantially vertical profile.

Additionally, in some embodiments, before the epitaxial growth process, a light etch treatment (LET) process is performed to remove foreign materials or native oxide from the exposed surface of the substrate 31 at the bottom of each opened region 40. The LET process is performed using a mixture gas of, e.g., $CF_4$ and $O_2$, in a downstream-type plasma etcher.

Next, a source region and a drain region are formed by doping impurities on the upper part of each pillar pattern 42. The source and drain regions define therebetween a vertical channel on each pillar pattern 42 corresponding to the respective buried bit line.

Figure 11A:
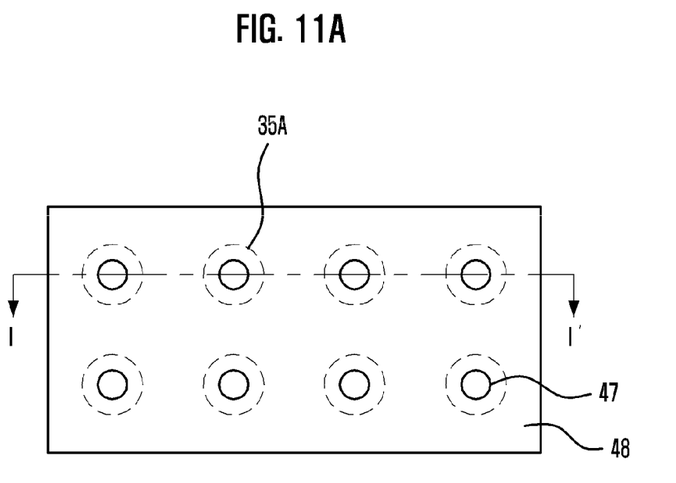
Figure 11B:
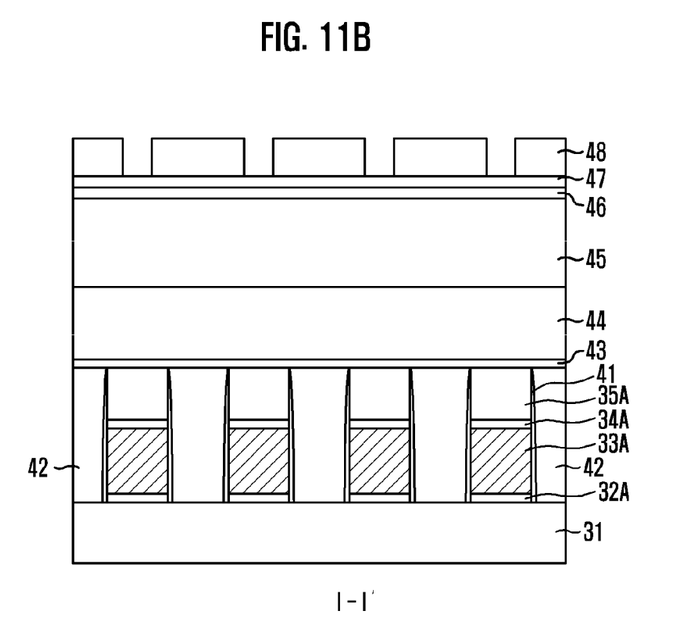

As shown in FIGS. 11A and 11B, a pad oxide layer 43 and a gate hard mask layer 44 are formed in sequence on the upper surfaces of the pillar patterns 42 and the hard mask layer pattern 35A.

The gate hard mask layer 44 is a thin film for protecting the pillar patterns 42 and for patterning the underlying layers, and it is formed of a nitride layer or an oxide layer, or a stacked structure thereof. The pad oxide layer 43 is formed to relieve thin film stresses of the gate hard mask layer 44 and the pillar patterns 42.

Subsequently, an amorphous carbon layer 45, a silicon oxynitride layer 46, an antireflection layer 47 and a photoresist pattern 48 are formed on the gate hard mask layer 44 in sequence. The resulting multilayer structure has a top plan view shown in FIG. 11A. FIG. 11B is a cross-sectional view taken long line I-I' of FIG. 11A. In some embodiments, another hard mask layer (not shown) is further interposed between the gate hard mask layer 44 and the amorphous carbon layer 45 to help patterning the gate hard mask layer 44.

The photoresist pattern 48 has multiple photoresist projections denoted at 48 in FIG. 11A, an opened region where the underlying antireflection layer 47 is exposed. The conductive layer 33 under the opened region of the photoresist pattern 48 will be later removed. Each photoresist projection of the photoresist pattern 48 is located above and corresponding to one pillar pattern 42. In the plan view of FIG. 11A, the boundary of the pillar pattern 42 (dot-dot lines) is positioned completely within the boundary of the respective photoresist projection of the photoresist pattern 48. In some embodiments, each photoresist projection and the corresponding pillar pattern 42 have the same shape, e.g., circular shapes as shown in FIG. 11A. Other shapes, as discussed above, are not excluded. In some embodiments, each photoresist projection and the corresponding pillar pattern 42 are coaxially.

Figure 12A:
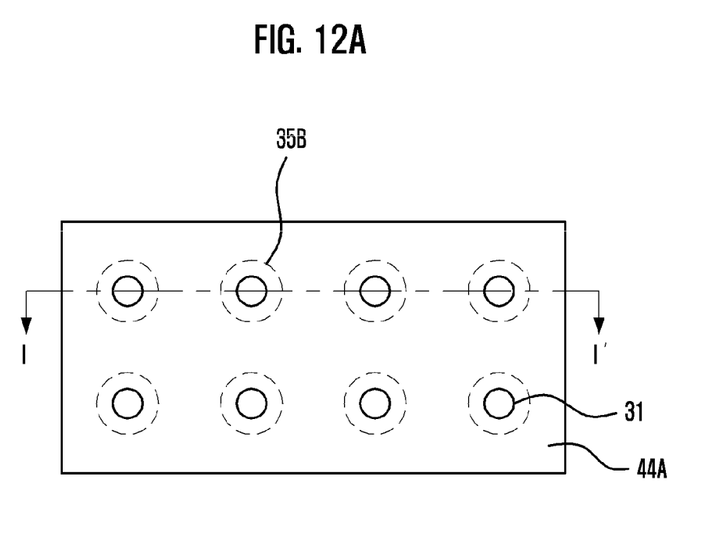
Figure 12B:
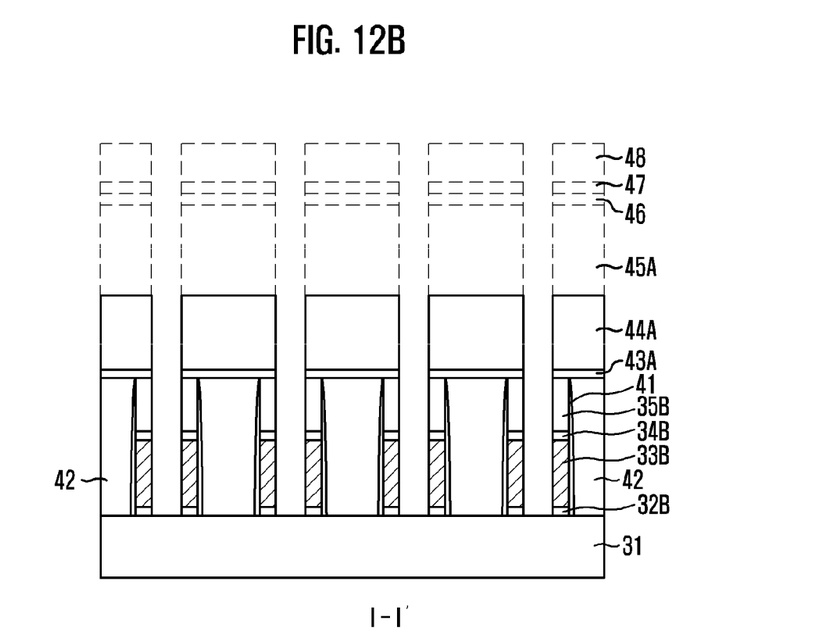

As shown in FIGS. 12A and 12B, the antireflection layer 47, the silicon oxynitride layer 46, and the amorphous carbon layer 45 are etched, in, e.g., a fifth etching process, using the photoresist pattern 48 as an etching barrier or mask.

After that, the gate hard mask layer 44 and the pad oxide layer 43 are etched, in, e.g., a sixth etching process, using an amorphous carbon layer pattern 45A formed by etching the amorphous carbon layer 45 as an etching barrier or mask, and then the hard mask layer pattern 35A, the second insulation layer pattern 34A, the conductive layer pattern 33A and the first insulation layer pattern 32A are etched, in, e.g., seventh and eights etching processes, using the gate hard mask layer pattern 44A as an etching barrier or mask. In some embodiments, the etching of the gate hard mask layer 44 and the underlying layers is performed in-situ or ex-situ. Reference numeral 43A represents a pad oxide layer pattern.

To be more specific, the hard mask layer pattern 35A is etched in the sixth etching process and using the gate hard mask layer pattern 44A as an etching barrier or mask and, in some embodiments, the etching stops on a surface of the second insulation layer pattern 34A. Subsequently, the second insulation pattern 34A and the conductive layer pattern 33A are etched in sequence, in the seventh etching process, using the same etching barrier, i.e., 44A. In some embodiments, the etching stops on a surface of the first insulation layer pattern 32A. Finally, the first insulation layer pattern 32A is etched in the eighth etching process, and, in some embodiments, the etching stops on a surface of the substrate 31. The fifth through eighth etching processes in some embodiments are similar to the first through fourth etching processes, respectively.

As a result of the etching processes discussed above, an etched first insulation layer pattern 32B, an etched second insulation pattern 34B, a gate electrode 33B and a sidewall protection layer 35B for protecting the upper portion of each pillar pattern 42 are formed on the sidewall of the pillar pattern 42. The gate insulation layer 41, the gate electrode 33B and the sidewall protection layer 35B are shaped to surround the pillar pattern 42.

After that, the photoresist pattern 48, the antireflection layer 47, the silicon oxynitride layer 46 and the amorphous carbon layer pattern 45A are removed, e.g., by a process similar to the process for removing layers 39-36.

Next, a capacitor (not shown) is formed adjacent to the source and drain regions formed on each pillar pattern 42. As a result, a complete semiconductor device with vertical channels is fabricated.

Since the pillar patterns 42 are formed through the growth process rather than by etching the substrate 31, and since the growth process is performed to fill or bury the already formed opened regions 40, it is possible to prevent the pillar patterns 42, which now have sufficient mechanical strength, from leaning over.

Also, the heights of the opened regions 40 are made evenly, resulting in the heights of the pillar patterns 42 to be even as well. Accordingly, channels of the same length can be obtained.

In addition, since the gate electrode 33B is formed on a flat substrate 31 by depositing the conductive layer 33, forming the pillar pattern 42, and patterning the conductive layer 33 in sequence, formations of voids and seams, e.g., by the burial of a conductive layer as in the known device/method, can be avoided. Accordingly, attacks on the gate insulation layer and the substrate can be prevented.

Furthermore, since the sidewall protection layer 35B is covered with the gate hard mask layer pattern 44A from above, loss of the sidewall protection layer 35B can be avoided during the formation of the gate electrode 33B.

Accordingly, reliability and stability of semiconductor devices manufactured in accordance with various embodiments, particularly those of no more than 40 nm, can be enhanced and yield can be improved.

While specific embodiments have been described, it will be apparent to those skilled in the art that various changes and modifications may be made.

What is claimed is:

1. A method of fabricating a semiconductor device over a substrate having thereon a conductive layer, the method comprising:

patterning the conductive layer to form a plurality of opened regions;

after the patterning of the conductive layer, forming a gate insulation layer on only a sidewall of each of the opened regions by depositing a film over the substrate where the opened regions are formed and performing an overall etching process;

forming a plurality of pillar patterns each in one of the opened regions; and after forming the plurality of pillar patterns, forming a plurality of gate electrodes each on one of the pillar patterns by removing the conductive layer between the neighboring pillar patterns, wherein each of the gate electrodes surrounding one pillar pattern is isolated from the other gate electrodes by said removing, wherein the gate insulation layer covers an entire sidewall of each of the pillar patterns.

2. The method of claim 1, wherein each of the pillar patterns is grown, by a growth process, on the substrate and within the respective opened region.

3. The method of claim 2, wherein the growth process is an epitaxial growth process.

4. The method of claim 1, further comprising, before forming the pillar patterns:
performing a Light Etch Treatment (LET) process for cleaning a section of the substrate exposed at a bottom of each opened region.

5. The method of claim 1, wherein the conductive layer is patterned using hard mask layer patterns which are formed using a photoresist pattern which, in turn, comprises a plurality of through holes each corresponding to one of the opened regions to be formed.

6. The method of claim 1, wherein
the gate electrodes are formed, after forming the pillar patterns, by an etching process using a photoresist pattern as a mask,
said photoresist pattern comprises a plurality of projections each being located above and corresponding to one of the pillar patterns, wherein a boundary of each of the pillar patterns is positioned within a boundary of the respective projection as seen in plan view along a height direction of the pillar pattern.

7. A method of fabricating a semiconductor device, the method comprising:
sequentially forming a first etch stop layer, a conductive layer, a second etch stop layer, and a plurality of hard mask layer patterns over a substrate;
forming a plurality of opened regions by etching the second etch stop layer, the conductive layer and the first etch stop layer using the hard mask layer patterns as an etching barrier;
after the patterning of the conductive layer, forming a gate insulation layer on only a sidewall of each of the opened regions by depositing a film over the substrate where the opened regions are formed and performing an overall etching process;
forming a plurality of pillar patterns each inside one of the opened regions, wherein the gate insulation layer completely covers all sidewalls of the pillar patterns and the hard mask layer patterns;
forming a gate hard mask layer pattern covering each of the pillar patterns and a portion of the conductive layer surrounding the pillar pattern; and
forming a plurality of gate electrodes each surrounding one of the pillar patterns by etching portions of the conductive layer between the neighboring pillar patterns using the gate hard mask layer pattern as an etching barrier, wherein the gate electrodes individually surrounding the corresponding pillar patterns are physically isolated from each other.

8. The method of claim 7, wherein each of the pillar patterns is grown, by a growth process, on the substrate and within the respective opened region.

9. The method of claim 8, wherein the growth process is an epitaxial growth process.

10. The method of claim 7, further comprising, before forming the pillar patterns:
performing a Light Etch Treatment (LET) process for cleaning a section of the substrate exposed at a bottom of each opened region.

11. The method of claim 7, wherein the hard mask layer patterns are formed using a photoresist pattern which, in turn, comprises a plurality of through holes each corresponding to one of the opened regions to be formed.

12. The method of claim 11, wherein the second etch stop layer defines an etch stop during the formation of the hard mask layer patterns.

13. The method of claim 7, wherein the opened regions are formed by
etching the second etch stop layer and the conductive layer by using the hard mask layer patterns as an etching barrier until the first etch stop layer appears; and
etching the first etch stop layer by using the hard mask layer patterns as an etching barrier until the substrate appears.

14. The method of claim 7, wherein the gate hard mask layer pattern is formed after forming the pillar patterns and comprises a plurality of projections each being located above and corresponding to one of the pillar patterns, wherein a boundary of each of the pillar patterns is positioned within a boundary of the respective projection as seen in plan view along a height direction of the pillar pattern.

15. The method of claim 14, wherein each of the pillar patterns and the respective projection of the gate hard mask layer pattern are coaxial.

16. The method of claim 7, wherein
the gate hard mask layer pattern comprises a plurality of projections each being located above and corresponding to one of the pillar patterns, and
each of the gate electrodes is defined by the portion of the conductive layer surrounding the corresponding pillar pattern and covered by the corresponding projection of the gate hard mask layer pattern.

17. The method of claim 7, wherein each of the gate electrodes is annular as seen in plan view along a height direction of the corresponding pillar pattern.

18. A method of fabricating a semiconductor device over a substrate having thereon a conductive layer, the method comprising:
patterning the conductive layer to form a plurality of opened regions;
after the patterning of the conductive layer, forming a gate insulation layer on a sidewall of each of the opened regions;
forming a plurality of pillar patterns each in one of the opened regions; and
after forming the plurality of pillar patterns, forming a plurality of gate electrodes each on one of the pillar patterns by removing the conductive layer between the neighboring pillar patterns, wherein each of the gate electrodes surrounding the corresponding pillar pattern is physically isolated from the other gate electrodes by said removing, and wherein each of the gate electrodes is annular as seen in plan view along a height direction of the corresponding pillar pattern.

19. The method of claim 18, wherein
the gate electrodes are formed, after forming the pillar patterns, by an etching process using an etching barrier,
said etching barrier comprises a plurality of projections each being located above and corresponding to one of the pillar patterns, wherein a boundary of each of the pillar patterns is positioned within a boundary of the respective projection as seen in plan view along the height direction of the pillar pattern.

20. The method of claim 19, wherein
each of the projections of the etching barrier covers the corresponding pillar pattern and a portion of the conductive layer surrounding the pillar pattern, and said portion of the conductive layer remains after said removing and defines the corresponding gate electrode.

* * * * *